United States Patent
Co et al.

(10) Patent No.: US 6,910,162 B2
(45) Date of Patent: Jun. 21, 2005

(54) MEMORY-MODULE BURN-IN SYSTEM WITH REMOVABLE PATTERN-GENERATOR BOARDS SEPARATED FROM HEAT CHAMBER BY BACKPLANE

(75) Inventors: Ramon S. Co, Trabuco Canyon, CA (US); Tat Leung Lai, Torrance, CA (US); David Da-Wei Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 240 days.

(21) Appl. No.: 10/249,843

(22) Filed: May 12, 2003

(65) Prior Publication Data

US 2004/0230880 A1 Nov. 18, 2004

(51) Int. Cl.[7] .......................... G11C 29/00; G11C 7/00; G01R 31/02; G01R 31/26
(52) U.S. Cl. ....................... 714/718; 365/201; 324/760; 324/765
(58) Field of Search ................................ 714/718, 721, 714/724, 725, 734, 738, 742, 42, 48, 49, 54, 25; 365/200, 201, 206, 211; 324/760, 754, 757, 763, 756

(56) References Cited

U.S. PATENT DOCUMENTS

| | | | | |
|---|---|---|---|---|
| 5,317,532 A | * | 5/1994 | Ochii | ......................... 365/149 |
| 5,359,285 A | | 10/1994 | Hashinaga et al. | ...... 324/158.1 |
| 5,473,259 A | | 12/1995 | Takeda | ........................ 324/760 |
| 5,497,079 A | * | 3/1996 | Yamada et al. | .......... 324/158.1 |
| 5,543,727 A | | 8/1996 | Bushard et al. | ............. 324/760 |
| 5,582,235 A | | 12/1996 | Hamilton et al. | ........... 165/263 |
| 5,590,079 A | | 12/1996 | Lee et al. | .................... 365/201 |
| 5,982,189 A | | 11/1999 | Motika et al. | ............... 324/763 |
| 6,172,895 B1 | | 1/2001 | Brown et al. | ................... 365/63 |
| 6,279,141 B1 | | 8/2001 | Hsuan et al. | .................... 716/1 |
| 6,285,610 B1 | | 9/2001 | Chun | ......................... 365/201 |
| 6,357,023 B1 | * | 3/2002 | Co et al. | ........................ 714/42 |
| 6,363,510 B1 | | 3/2002 | Rhodes et al. | ............... 714/738 |
| 6,388,460 B1 | | 5/2002 | Fang et al. | ................... 324/760 |
| 6,467,053 B1 | | 10/2002 | Connolly et al. | ............. 714/39 |
| 6,473,346 B1 | | 10/2002 | Kim et al. | ................... 365/201 |
| 6,490,223 B1 | | 12/2002 | Han et al. | ..................... 365/233 |
| 2001/0026009 A1 | | 10/2001 | Tsunesa et al. | ............. 257/673 |
| 2002/0196047 A1 | | 12/2002 | Doherty et al. | ............. 324/765 |

* cited by examiner

*Primary Examiner*—Christine T. Tu
(74) *Attorney, Agent, or Firm*—Stuart T. Auvinen

(57) ABSTRACT

An environmental tester for memory modules has an environmental chamber for heating the memory modules being tested. One side of the chamber is a backplane. The memory modules are inserted into sockets on module motherboards, which are inserted into motherboard sockets on the backplane. On the other side of the backplane, card sockets receive pattern-generator cards that are outside the environmental chamber but electrically connected to the module motherboards through the backplane. The pattern-generator cards contain pattern-generators that generate address, data, and control signals that exercise the memory modules. The pattern-generator cards can be cooled while the memory modules in the environmental chamber are heated. Pattern-generator cards can be removed for repair and module motherboards can be removed for inserting new memory modules for testing.

20 Claims, 5 Drawing Sheets

MEMORY-MODULE BURN-IN SYSTEM WITH REMOVABLE PATTERN-GENERATOR BOARDS SEPARATED FROM HEAT CHAMBER BY BACKPLANE

BACKGROUND OF INVENTION

This invention relates to environmental test systems, and more particularly to memory module burn-in testers.

High-availability and critical systems such as web or transaction servers required the use of enhanced-reliability components. Additional testing can be performed on components such as board assemblies, semiconductor chips, and memory modules. Often this additional testing is often performed at an elevated temperature. Thus environmental testing is sometimes known as burn-in.

Weak components often fail earlier at elevated temperatures that at normal temperatures. Poor solder connections on boards or modules can break at higher temperatures, and thermal expansion can loosen poorly seated components. Other manufacturing defects that do not cause immediate failures can create failures that appear after many hours of normal operation at normal temperatures, or after just a few hours at elevated temperatures. Thus elevated-temperature testing can screen for weak components that might later fail in the field, enhancing reliability.

Electronic systems such as servers and personal computers (PCs) use dynamic-random-access memory (DRAM) memory chips mounted on small, removable memory modules. Older single-inline memory modules (SIMMs) have been replaced with dual-inline memory modules (DIMMs), 184-pin RIMMs (Rambus inline memory modules) and 184-pin DDR (double data rate) DIMMs. New kinds of memory modules continue to be introduced.

The memory-module industry is quite cost sensitive. Testing costs are significant, especially for higher-density modules. Specialized, high-speed electronic test equipment is expensive, and the greater number of memory cells on high-speed memory modules increases the time spent on the tester, increasing test costs.

Burn-in testing can be quite expensive, as each module may have to remain at an elevated temperature in a specialized burn-in tester for many hours or even days. Ideally, the memory module is exercised electronically during the burn-in testing, rather than simply be stored at the high temperature and later tested. Operating the memory module at higher frequencies increases internal heating within the DRAM chips, providing more realistic and thorough testing, increasing reliability.

Exercising the memory modules at higher frequencies is difficult, especially when the modules are within a burn-in oven or heated test chamber. Cables or wires that connect an external test-pattern generator or other test equipment to the memory modules within the oven can be long, severely limiting the frequency of operation.

What is desired is a burn-in test system for testing memory modules at elevated temperatures. An elevated-temperature memory module tester is desired that can exercise the memory modules at high frequencies is desirable. A low cost burn-in tester that can be easily repaired and updated is desirable.

BRIEF DESCRIPTION OF DRAWINGS

FIGS. 3A–B show back and front sides of the burn-in backplane with pattern-generator cards and module motherboards plugged in.

DETAILED DESCRIPTION

The present invention relates to an improvement in memory-module testers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
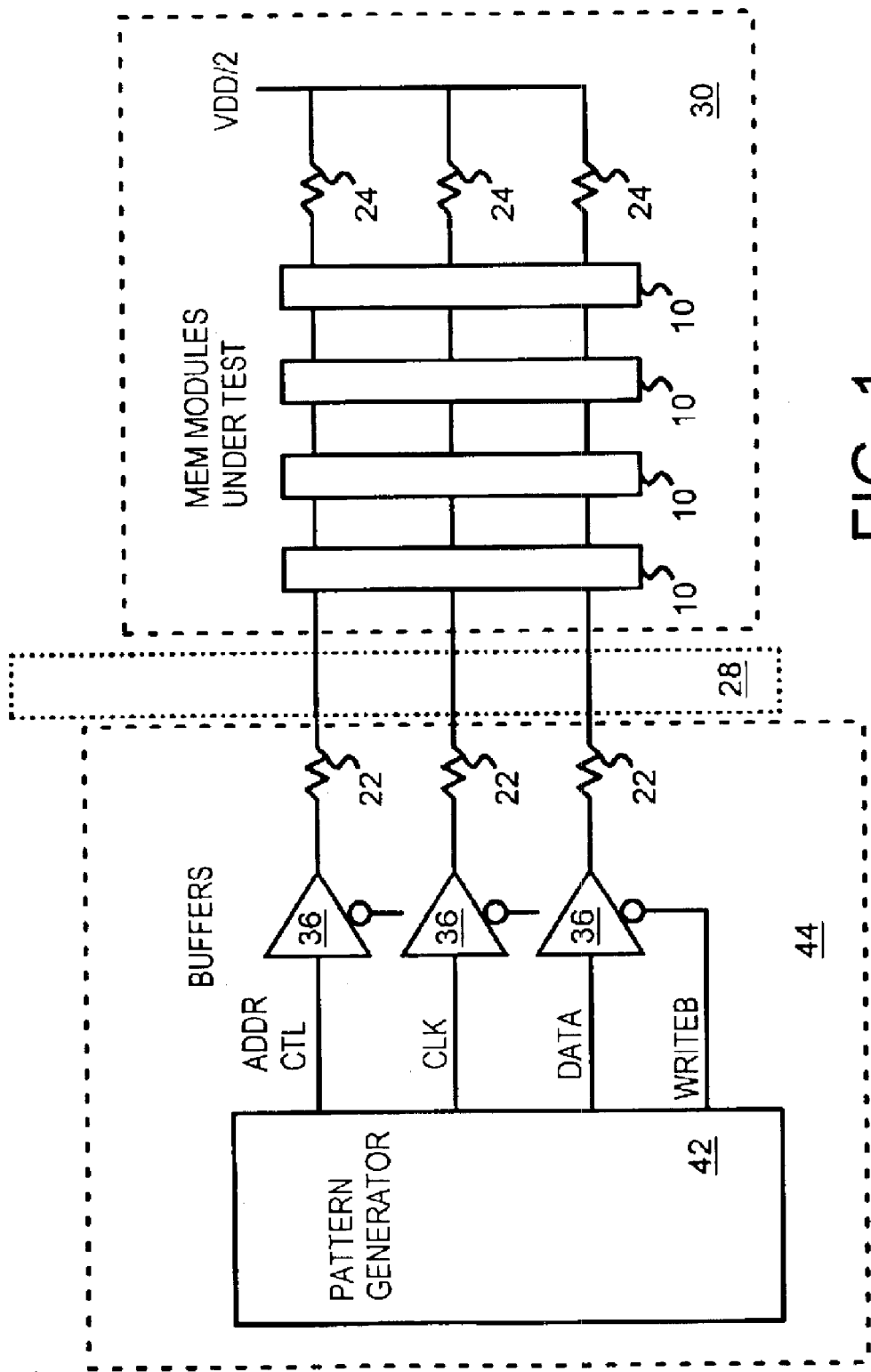
FIG. 1 is an electrical block diagram of a burn-in tester of memory modules.

FIG. 1 is an electrical block diagram of a burn-in tester of memory modules. Backplane 28 separates pattern-generator card 44 from module motherboard 30. A socket (not shown) on the back side of backplane 28 receives an edge of pattern-generator card 44 while a socket (not shown) on the front side of backplane 28 receives an edge of module motherboard 30. Wiring traces and vias on backplane 28 connect signals on the front-side and back-side sockets.

Pattern-generator card 44 contains pattern-generator 42, which can be a logic chip containing a pattern-generator circuit. A programmable logic chip such as a field-programmable gate array (FPGA) may be used for pattern-generator 42. Pattern-generator 42 generates the control, address, and data signals necessary to exercise memory modules 10 inserted into sockets on module motherboard 30. Memory cells on memory modules 10 are addressed in a sequence and written by pattern-generator 42. Pattern-generator 42 can read back the data from the memory cells. The read data can be compared to expected data by pattern-generator 42, or the read data can simply be ignored. Failures can be detected later by external testing once the memory modules are removed from the burn-in tester.

Buffers 36 provide the necessary drive current to drive the large input capacitances of memory modules 10. A write signal from pattern-generator 42 can disable some of buffers 36 (such as data buffers) during read operations or can be used to reverse direction.

A clock signal for synchronous DRAMs can also be driven from pattern-generator 42 or from a zero-delay buffer 36 such as from a phase-locked loop (PLL). Other specialized clock-driver circuits can be substituted. Buffers 36 may include registers on some signals; the registers can be clocked by the clock signal or by some other signal. Buffers 36 could be located on pattern-generator card 44 or on module motherboard 30.

Termination is provided by resistors 22, 24. These resistors 22, 24 are useful for reduced DRAMs such as on double-data-rate (DDR) memory modules. The values of resistors 22, 24 can be chosen to reduce the voltage swing to half the normal supply-voltage (Vcc) swing. Expansion is possible by cascading buffers, modules, and terminations.

Figure 2:
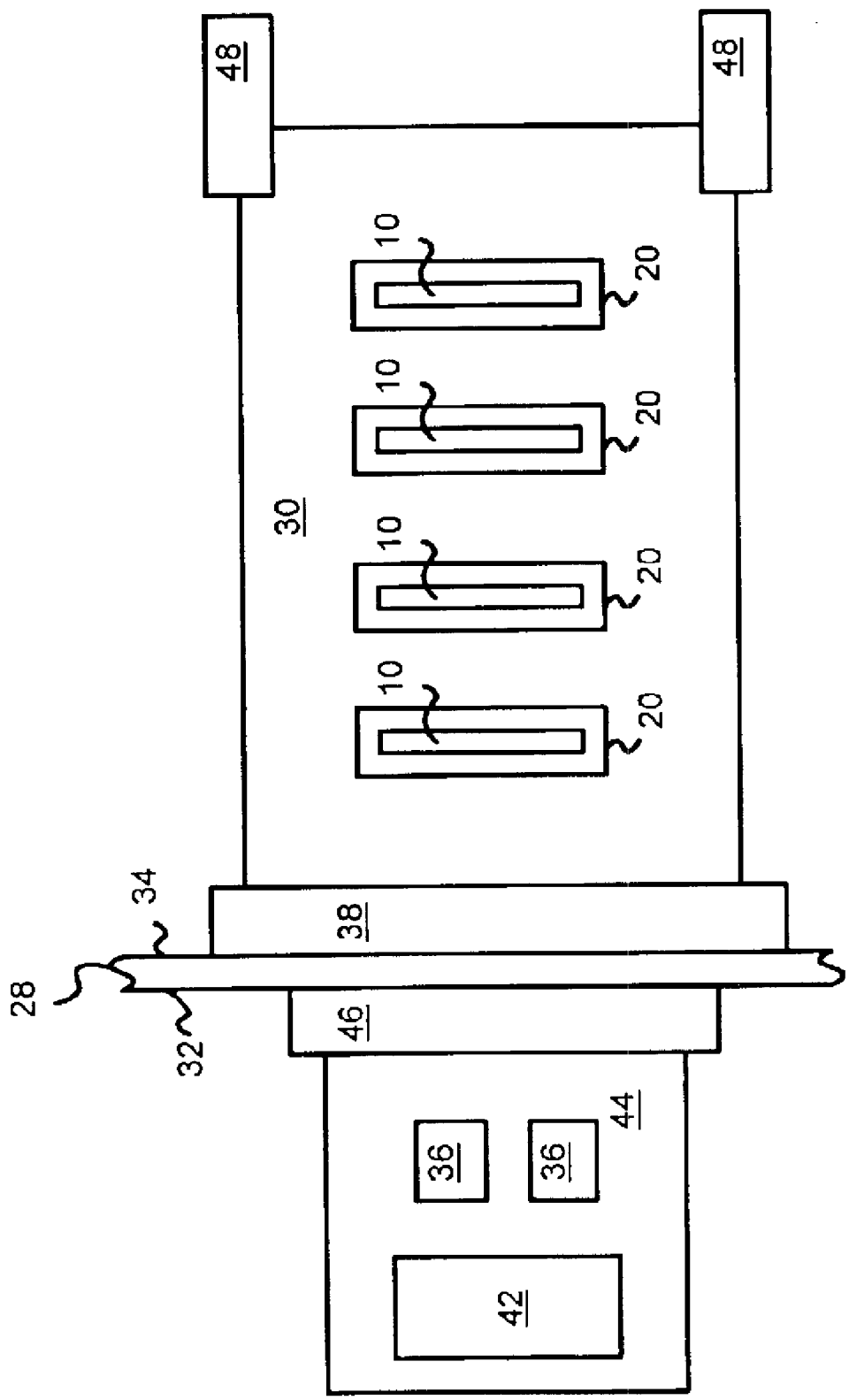
FIG. 2 is a side view of a pattern-generator card and a module motherboard plugged into a portion of the backplane.

FIG. 2 is a side view of a pattern-generator card and a module motherboard plugged into a portion of the backplane. Card socket 46 receives an edge of pattern-generator card 44 that has contact pads to make electrical contact in the socket. Signals such as address, data, and DRAM control are generated by pattern-generator 42 and buffered by buffers 36 on pattern-generator card 44.

Card socket 46 is mounted to back-side 32 of backplane 28, while motherboard socket 38 is mounted to front-side 34 of backplane 28. Metalized vias and traces on backplane 28 connect signals in card socket 46 to corresponding signals in motherboard socket 38.

An edge of module motherboard 30 contains contact pads that are inserted into motherboard socket 38. Signals from these contact pads are routed to memory-module sockets 20 by traces on module motherboard 30. Memory modules 10 are inserted into memory-module sockets 20 for burn-in testing. Signals can be routed in parallel to all memory-module sockets 20, while some signals may be applied to just one of memory-module sockets 20, or unique address or socket-select signals can differ among memory-module sockets 20 to allow one of memory modules 10 to be addressed separately from the others. When data is not read back for comparison by pattern-generator 42, then identical, parallel signal connections can be used for all memory-module sockets 20.

A technician or operator can remove module motherboard 30 using ejectors 48 to grip module motherboard 30. Once removed, memory modules 10 can be removed for further testing by another (post burn-in) tester and new memory modules 10 inserted into memory-module sockets 20. Module motherboard 30 can then be re-inserted to burn-in test the new modules.

Pattern-generator card 44 can also be removed from card socket 46 by a technician. This allows for defective pattern-generator cards 44 to be removed for repair while another pattern-generator card 44 is inserted. Different types of pattern-generator card 44 can be inserted into card socket 46 for testing different types of memory modules, or for specialized testing.

Figure 3B:
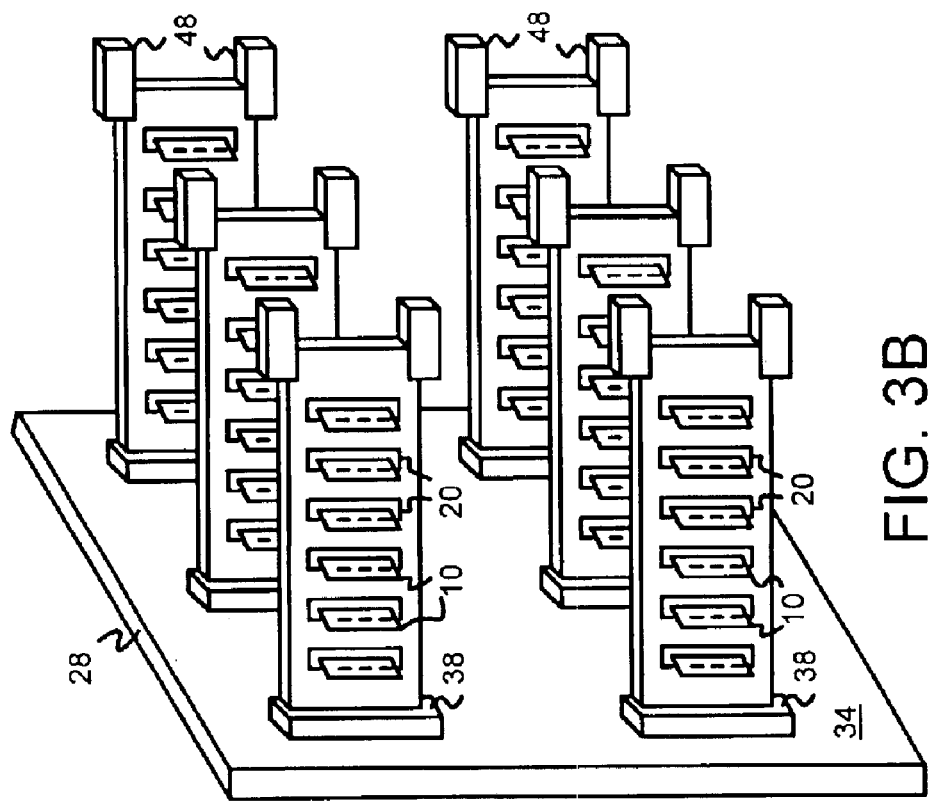
Figure 3A:
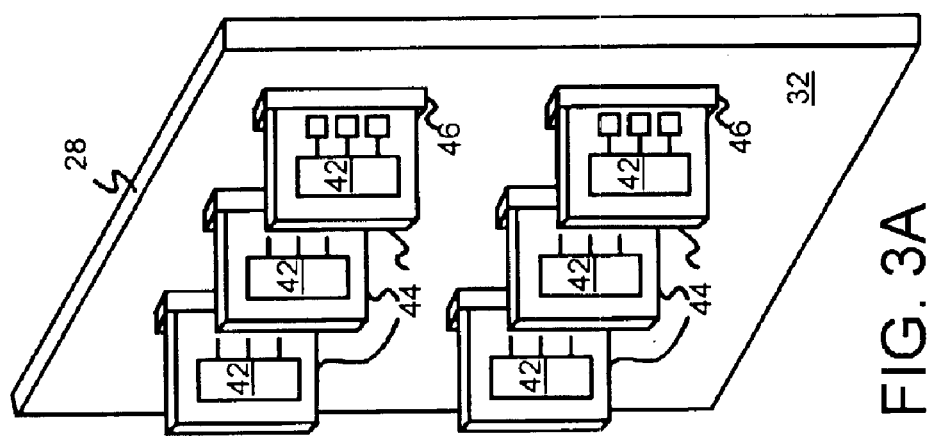

FIGS. 3A–B show back and front sides of the burn-in backplane with pattern-generator cards and module motherboards plugged in. In FIG. 3A, back-side 32 of backplane 28 has many card sockets 46 in rows and columns. Each card socket 46 can receive a pattern-generator card 44 that contains a pattern-generator 42 that generates control signals for one module motherboard 30 plugged into the other side of backplane 28 (FIG. 3B). Wiring traces formed in and on backplane 28 connect electrical signals from one card socket 46 on back-side 32 to one motherboard socket 38 on front-side 34.

In FIG. 3B, front-side 34 of backplane 28 is shown. Rows and columns of motherboard socket 38 are arrayed on front-side 34. Each motherboard socket 38 can receive a module motherboard 30. Memory modules 10 inserted into memory-module sockets 20 are tested by an opposing pattern-generator card 44 on the opposite side of backplane 28. Ejectors 48 are useful for removing and inserting module motherboard 30 into motherboard socket 38 before and after burn-in testing.

Figure 4:
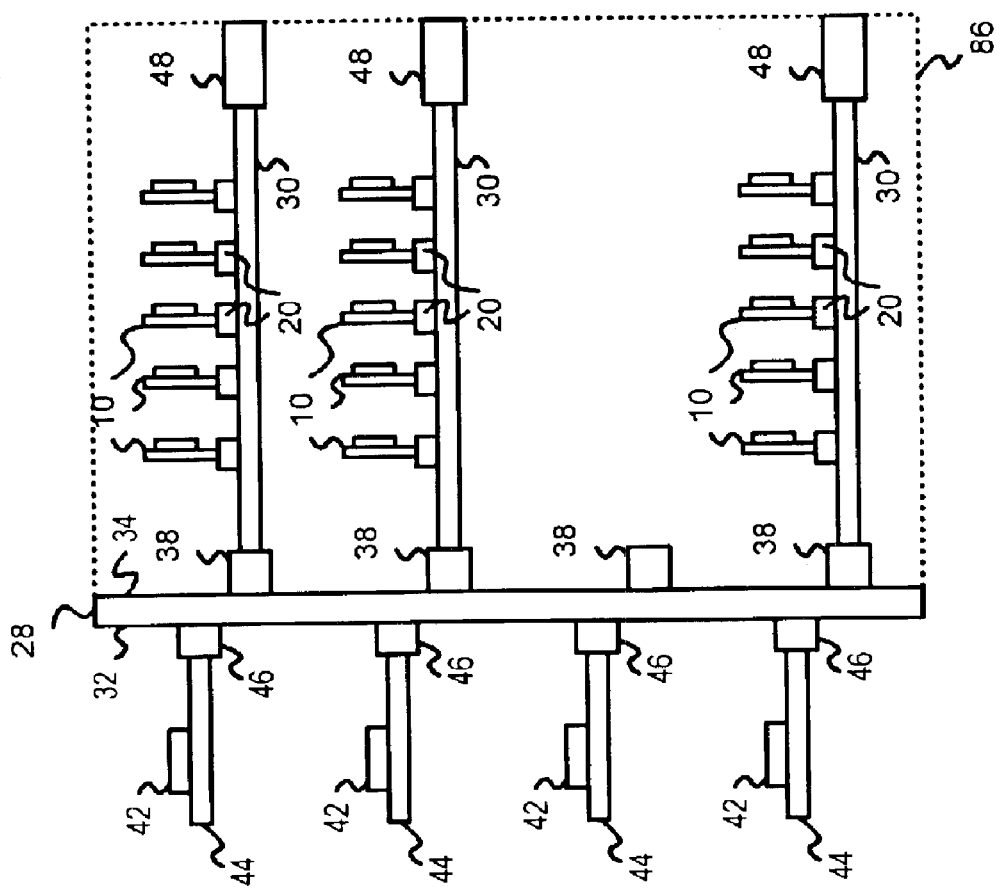
FIG. 4 is an overhead view of a burn-in tester for memory modules.

FIG. 4 is an overhead view of a burn-in tester for memory modules. Memory modules 10 inserted into memory-module sockets 20 on module motherboards 30 are kept at an elevated temperature by blowing hot air into a heat chamber surrounding module motherboards 30. This heat chamber is enclosed by backplane 28 and by sides 86 and top and bottom dividers (not shown).

Pattern-generator cards 44 are inserted into card sockets 46 on back-side 32 of backplane 28, and can be kept at a cooler temperature than module motherboards 30, since pattern-generator cards 44 are outside of the heat chamber formed by backplane 28 and sides 86. Backplane 28 provides some insulation between the heat chamber and pattern-generator cards 44, allowing pattern-generator 42 to be at a lower temperature than memory modules 10.

The front or sides 86 of the heat chamber can be temporarily opened to allow removal of module motherboards 30 from motherboard sockets 38. Ejectors 48 face the front of the heat chamber, allowing a technician to pull module motherboard 30 out of motherboard socket 38 through the open front of the heat chamber.

Figure 5:
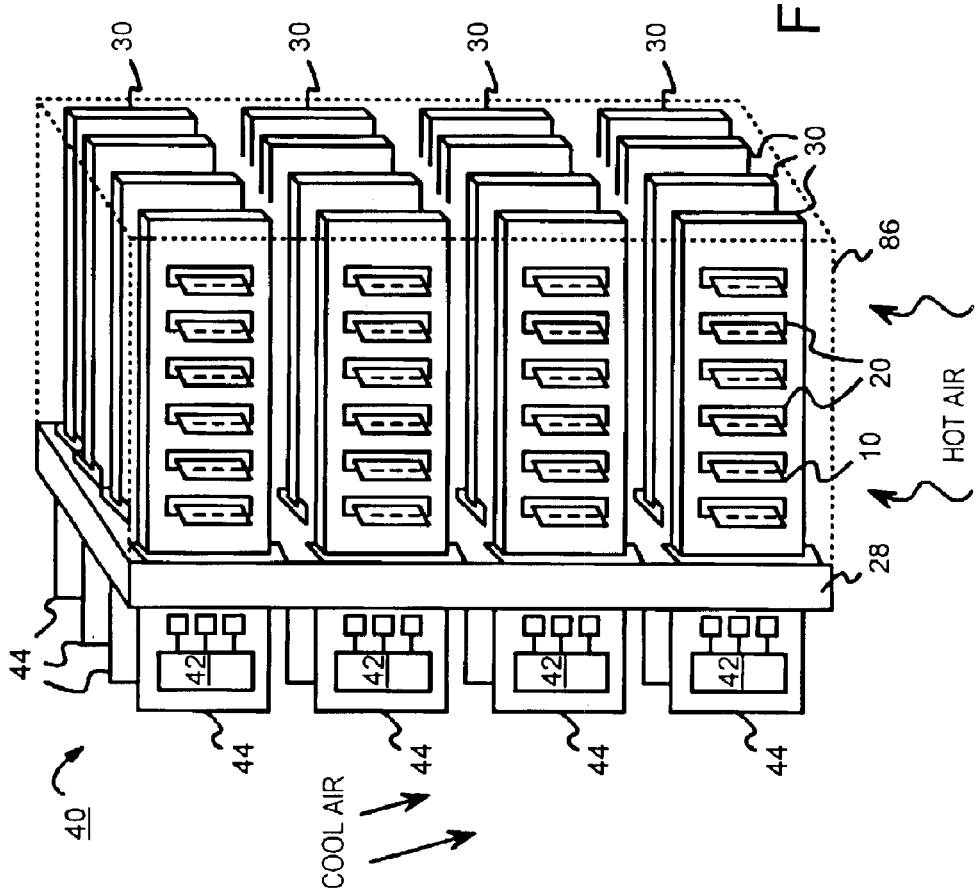
FIG. 5 is a perspective view from the front left of the burn-in tester.

FIG. 5 is a perspective view from the front left of the burn-in tester. Hot air can be blown into the bottom or sides 86 of the heat chamber, rising past module motherboards 30 to raise the temperature of memory modules 10 inserted into memory-module sockets 20.

Backplane 28 not only provides electrical connection from each pattern-generator card 44 to each module motherboard 30, but provides some thermal insulation. Pattern-generator cards 44 are kept cooler than module motherboards 30 because back area 40 is separated from the heat chamber of sides 86 by backplane 28.

Cool air can be blown across pattern-generator cards 44 while hot air is blown through the heat chamber across module motherboards 30. Pattern-generators 42 on pattern-generator cards 44 can be kept cooler than memory modules 10, allowing for longer life and better current drive of pattern-generator 42.

Backplane 28, pattern-generator cards 44, and module motherboards 30 can be mounted on a rack that is enclosed by sides 86. Several racks can be mounted on top of each other, or beside one another in a larger burn-in unit enclosure. Hot air can be blown in from the bottom or sides of the unit. Local heaters, thermocouples, or other temperature-sensors can also be used to better regulate and control heating. The unit could be turned, rotated, flipped, or otherwise re-oriented. Cooling, humidity, or other environmental testing could also be performed.

Backplane 28 can route power and ground to all pattern-generator cards 44 and all module motherboards 30. Monitoring and control signals can also be routed through backplane 28, such as reset signals to pattern-generators 42 or result or status data from pattern-generator 42 to a central controller or network interface to a host.

Alternate Embodiments

Several other embodiments are contemplated by the inventors. All memory modules designated as high reliability can be tested within the burn-in system for various periods of time, or only a sampling of memory modules from production runs can be tested within the burn-in chamber to monitor reliability and detect manufacturing problems. Prototype and engineering testing can also be performed. Other testing of the memory modules can also be performed before or after testing within the burn-in system.

Pattern-generator 42 could use a standard DRAM controller activated by a programmable device such as a processor or state machine, or pattern-generator 42 could be a state machine or controller. Buffers could be located on pattern-generator card 44 in the cooler environment, or could be located on module motherboard 30 in the hot environment, but closer to the memory modules being driven. Some buffers, registers, or clock drivers could be on pattern-generator card 44 while others are on module motherboard 30 or even on backplane 28. Patterns could be generated to write all locations on large DRAM chips, such as by writing to a million or more addresses.

Rather than have each module motherboard 30 driven by one pattern-generator card 44, a pattern-generator card 44 could drive several module motherboards 30.

The number of test sockets on the motherboards could vary, and additional components could be added to the module motherboards. More than one edge socket could be used for each connection. Different mounting mechanisms and electrical connections could be substituted. The motherboard and pattern-generator card may be substantially perpendicular to the backplane by being at an angle such as from 60 to 120 degrees rather than exactly 90 degrees.

A thicker fiberglass board or other additional insulation that better insulates the pattern-generator cards from the elevated temperatures near module motherboards can also be used.

Many kinds of memory modules can be tested. Modules using standard DRAM or newer EDO and synchronous DRAM can be tested. The system is ideally suited for testing the highest-speed memory modules, since signal trace length and capacitive loading is minimized. Other memories such as RAMBUS modules, DDR modules, and PC133 synchronous modules can be tested.

Various sizes of memory in the memory module, and form factors for memory modules can be used with the invention, limited by the module motherboard 30 and memory-module sockets 20. Different kinds of module motherboards and pattern-generator cards can be substituted.

A Yamaichi type connector could be used as the memory-module sockets, but a production-quality connector/socket with low insertion force may be substituted. A production quality connector/socket can take more insertions (greater than 100,000 times) than conventional sockets on motherboards (rated for 100 insertions). A production socket also has an ejector normally located at the 2 edges of the socket. This alleviates the ejection of modules.

A network controller card on the ISA or PCI bus that communicates with a main system interface or host can be used. A controller card or a standard parallel or serial-port may interface to the main system interface or host. FireWire, USB, or other emerging standards can be used for the interfaces.

Cascading or expansion is possible. Capacitive loading by the memory modules can limit the number of modules that can be placed on a bus for a given operating frequency. In order to use one pattern generator card, another buffer can be placed at the end of the bus for regenerating the test signal. The regenerated test signal is used to drive a subsequent bank of modules and terminations. This is possible when all the test signals are propagating in the same direction, for example, writes to the modules only.

During writes, all memory modules can be selected and written in parallel at the same time. There can be separate module select lines (static, not dynamic) for each module. Writing can happen concurrently on all modules. During read, only one module is selected, and a bus conflict is avoided. The read data can be read back or ignored. The address, data, and most control lines are bussed in parallel; the module select lines are not. The module select lines are DRAM chip selects which are made available as pins on the memory module for the module select function.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An environmental tester for memory modules comprising:

a backplane forming one side of an environmental chamber;

motherboard sockets mounted on a first side of the backplane;

removable module motherboards for insertion into the motherboard sockets;

a plurality of memory-module sockets mounted on each of the removable module motherboards, the plurality of memory module sockets for receiving memory modules for environmental testing in the environmental tester;

card sockets mounted on a second side of the backplane;

removable pattern-generator cards for insertion into the card sockets; and a pattern-generator on each of the removable pattern-generator cards for generating address, data, and control signals to write data to a plurality of memory locations on memory chips on the memory modules inserted into the memory-module sockets on the removable module motherboards, whereby memory modules are tested within the environmental chamber by pattern-generators on removable pattern-generator cards outside the environmental chamber that are separated by the backplane that forms one side of the environmental chamber.

2. The environmental tester of claim 1 wherein the first side of the backplane is an inner side facing inward into the environmental chamber and the second side of the backplane is an outer side facing away from the environmental chamber.

3. The environmental tester of claim 2 wherein the backplane comprises wiring traces and vias for connecting signals from the motherboard sockets to corresponding signals from the card sockets.

4. The environmental tester of claim 3 wherein the backplane includes a power bus and a ground bus for supplying power and ground to the removable pattern-generator cards and the removable module motherboards.

5. The environmental tester of claim 2 wherein the environmental chamber completely encloses the removable module motherboards when inserted fully into the motherboard sockets.

6. The environmental tester of claim 5 further comprising:
heating means for heating memory modules inserted into the removable module motherboards within the environmental chamber.

7. The environmental tester of claim 6 further comprising:
cooling means for cooling the pattern-generator on the removable pattern-generator cards.

8. The environmental tester of claim 2 wherein the motherboard sockets are arrayed in rows and columns on the first side of the backplane;
wherein the card sockets are arrayed in rows and columns on the second side of the backplane.

9. The environmental tester of claim 8 wherein the motherboard sockets are arrayed in X rows and Y columns on the first side of the backplane;
wherein the card sockets are arrayed in X rows and Y columns on the second side of the backplane;
wherein X and Y are whole numbers of 2 or more.

10. The environmental tester of claim 9 wherein the backplane electrically connects signals from a card socket at row I and column J to a motherboard socket at row I and column J;
wherein I is a whole number from 1 to X and J is a whole number from 1 to Y,
whereby corresponding card and motherboard sockets are connected by the backplane.

11. The environmental tester of claim 8 wherein the removable module motherboards are mounted vertically within the environmental chamber.

12. The environmental tester of claim 11 wherein the removable pattern-generator cards are mounted vertically outside the environmental chamber.

13. The environmental tester of claim 2 further comprising:
buffers, coupled to the pattern-generator, for buffering signals driving the memory modules.

14. The environmental tester of claim 13 wherein the buffers are mounted on the removable pattern-generator cards.

15. The environmental tester of claim 13 wherein the buffers are mounted on the removable module motherboards.

16. The environmental tester of claim 2 wherein the plurality of memory locations includes at least one million unique locations per memory module.

17. A memory-module burn-in system comprising:
a chamber for heating memory modules;
a backplane forming a side of the chamber, for making electrical connections, the backplane having an inner side facing into the chamber and an outer side facing away from the chamber;
external connector sockets, on the outer side of the backplane;
internal sockets, on the inner side of the backplane;
wherein each external connector socket is electrically connected to a corresponding inner socket;
pattern-generator cards inserted into the external connector sockets, for generating test patterns to write locations in dynamic-random-access memory (DRAM) chips on the memory modules heated in the chamber; and
module motherboards inserted into the internal sockets, containing memory module sockets for receiving the memory modules, each module motherboard being within the chamber and having wiring traces for connecting signals carrying the test patterns from the pattern-generator cards passed through the backplane to the internal socket to the memory modules inserted into the memory module sockets on the module motherboard;
wherein the pattern-generator cards are external to the chamber but the module motherboards are inside the chamber,
whereby memory modules are heated in the chamber and tested by the module motherboards using test patterns generated externally by the pattern-generator cards.

18. The memory-module burn-in system of claim 17 wherein hot air is blown through the chamber to heat the memory modules inserted into the module motherboards;
wherein cooling air is blown onto the pattern-generator cards to cool the pattern-generator cards.

19. A burn-in chamber for testing memory modules comprising:
pattern-generator means for generating test patterns for testing dynamic-random-access memory (DRAM) chips on memory modules;
first socket means for electrically connecting and mechanically supporting an external card external to a heated portion of the burn-in chamber;
pattern-generator card means for removably connecting the pattern-generator means to the first socket means;
second socket means for electrically connecting and mechanically supporting an internal card inside the heated portion of the burn-in chamber;
module motherboard means for removably connecting to the second socket means;
memory module socket means, on the module motherboard means, for receiving memory modules for testing on the burn-in chamber; and
backplane means for electrically connecting a first socket means to a second socket means;
wherein the backplane means is further for thermally insulating the module motherboard means inside the heated portion of the burn-in chamber from the pattern-generator card means external to the heated portion of the burn-in chamber,
whereby externally generated test patterns are passed through the backplane means into the heated portion of the burn-in chamber.

20. The burn-in chamber of claim 19 further comprising:
a plurality of rows and columns of the first socket means and the second socket means, for receiving pluralities of the pattern-generator card means and the module motherboard means.

* * * * *